United States Patent [19]

Razouk

[11] 4,455,325
[45] Jun. 19, 1984

[54] METHOD OF INDUCING FLOW OR DENSIFICATION OF PHOSPHOSILICATE GLASS FOR INTEGRATED CIRCUITS

[75] Inventor: Reda Razouk, Sunnyvale, Calif.

[73] Assignee: Fairchild Camera and Instrument Corporation, Mountain View, Calif.

[21] Appl. No.: 456,200

[22] Filed: Jan. 7, 1983

Related U.S. Application Data

[63] Continuation of Ser. No. 243,990, Mar. 16, 1981, abandoned.

[51] Int. Cl.³ .......................................... H01L 21/02
[52] U.S. Cl. .................................... 427/85; 65/32; 65/102; 65/104; 29/577 C; 148/1.5; 427/93
[58] Field of Search ................... 65/32, 42, 134, 50, 65/135, 55, 59.32, 102, 104, 106; 501/63, 54, 24; 427/85, 82, 93; 357/52, 73, 71; 29/577 C; 148/1.5

[56] References Cited

U.S. PATENT DOCUMENTS

| | | | |
|---|---|---|---|
| 2,634,555 | 4/1953 | Henry et al. | 65/135 |
| 3,224,851 | 12/1965 | Hicks | 65/32 X |
| 3,328,145 | 6/1967 | McMillan et al. | 65/50 |
| 3,490,886 | 1/1970 | Stoll | 65/42 X |
| 3,625,669 | 12/1971 | Norton | 65/32 |
| 3,819,348 | 6/1974 | Murray | 65/42 X |
| 3,825,442 | 7/1974 | Moore | 357/73 |
| 4,059,425 | 11/1977 | Brydges et al. | 65/32 X |
| 4,068,020 | 1/1978 | Revschel | 427/82 X |
| 4,194,643 | 3/1980 | Hager et al. | 65/42 X |
| 4,221,824 | 9/1980 | Leonard et al. | 501/24 X |
| 4,251,251 | 2/1981 | Blankenship | 65/3 A |
| 4,271,582 | 6/1981 | Shirai et al. | 357/73 |
| 4,349,584 | 9/1982 | Flatley et al. | 427/85 |

Primary Examiner—Kenneth M. Schor
Attorney, Agent, or Firm—Kenneth Olsen; Carl L. Silverman; Alan H. MacPherson

[57] ABSTRACT

Phosphorus-doped silicon oxide glass is flowed on an integrated circuit by raising the pressure in which that integrated circuit is placed above atmospheric for a selected period of time and heating said phosphosilicate glass to a selected temperature sufficient to cause said glass to flow at said pressure. The atmosphere in which the device is placed includes moisture to enhance the flow of the glass at temperatures substantially beneath those at which dopants in the underlying integrated circuit move. The result is that the electrical characteristics of the integrated circuit are not substantially altered during glass flow.

9 Claims, 4 Drawing Figures

METHOD OF INDUCING FLOW OR DENSIFICATION OF PHOSPHOSILICATE GLASS FOR INTEGRATED CIRCUITS

This application is a continuation of application Ser. No. 243,990, filed Mar. 16, 1981 and now abandonded.

BACKGROUND OF THE INVENTION

1. Field of the Invention

This invention relates to the reflow or densification of glasses commonly employed as insulation and passivation layers in integrated circuits and particularly to methods of inducing flow or densification of these glasses.

2. Description of the Prior Art

Presently, phosphorus doped silicon oxide glasses (known as "phosphosilicate" glasses) are used in integrated circuits as insulation between the silicon material and integrated circuit leads and as insulation between various levels of conductive leads formed on integrated circuits containing multiple layers of conductive leads. In order to reduce the frequency of occurrence of cracks and breaks in the lead pattern resulting from steps in the height of the glass film, the glass film is heated to reflow and smooth out the steps. Typically, a phosphosilicate glass film comprises a chemical vapor deposited oxide of silicon doped with approximately 7% to 9% by weight of phosphorus. This film is formed in a well-known manner in a "CVD" reactor using chemical vapor deposition techniques involving an inert ambient or an ambient containing phosphorus dopant. In the latter case, the deposition of the glass film is carried out selectively in order to selectively dope with phosphorus some areas of the semiconductor material to comprise active regions of the device. The presence of phosphorous dopants in this situation is not directly related to the flow process to redistribute and smooth out the glass.

The main shortcoming of the prior art is that the structure must be heated to in excess of 1000° C. in order to flow and densify the phosphosilicate glass. These elevated temperatures cause the dopants in the underlying semiconductor material to redistribute. Such redistribution is particularly undesirable and intolerable in the smaller and more advanced VLSI (very large scale intergration) devices now being developed where a small amount of redistribution causes a substantial change in device characteristics. The flow of phosphosilicate glass is discussed in a paper entitled "Phosphosilicate Glass Flow for Integrated Optics" by A. Naumaan and J. T. Boyd in the Journal of Vacuum Science Technology, January/February 1980.

SUMMARY OF THE INVENTION

In accordance with this invention, the flow of deposited phosphosilicate glasses is achieved at a temperature substantially beneath that commonly used in the prior art by use of a selected ambient at a high pressure. The use of the higher pressure substantially reduces the temperature at which the phosphosilicate glass reflows thereby substantially reducing the redistribution of dopant in the underlying semiconductor material. This invention may also be utilized with glasses other than phosphosilicate glass.

DETAILED DESCRIPTION OF THE INVENTION

Figure 1:
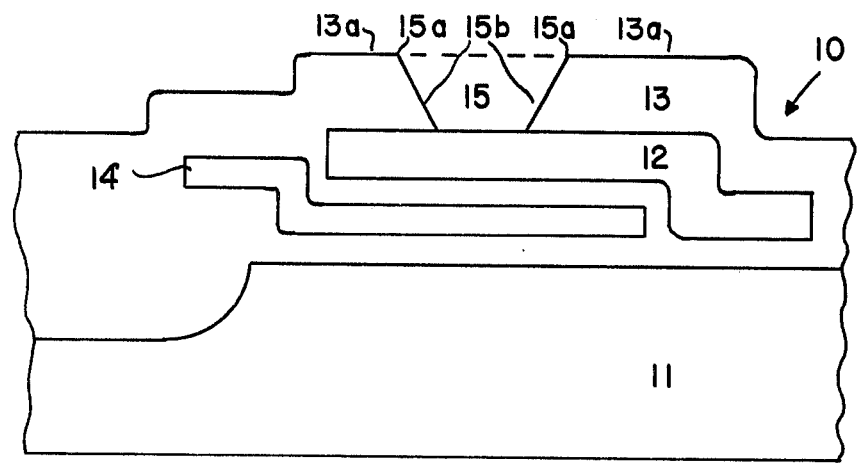
FIG. 1 illustrates a cross-section of a region of a semiconductor wafer (11) beneath a contact opening to polycrystalline silicon (12) underlying phosphosilicate glass (13) and with a via (15) cut through the phosphosilicate glass (13) to the underlying polycrystalline silicon (12) before reflow.

A semiconductor structure commonly employed is shown in FIG. 1. FIG. 1 illustrates a cross-section of a semiconductor device comprising a silicon substrate 11 on which is formed in a well-known manner an insulation layer 20 (typically silicon dioxide). A floating polycrystalline silicon conductive gate 14 is formed in a well-known manner and polycrystalline silicon 12 is formed above but insulated from a portion of floating gate 14. Phosphosilicate glass 13 is then formed above polycrystalline silicon gate 14 as shown, by a well-known process. Glass types other than phosphosilicate glass may also be used in accordance with this invention. Via or contact open 15 is then formed in phosphosilicate glass 13 typically using a well-known hydrofluoric acid etch to expose a portion of the top surface of polycrystalline silicon 12. The edge 15a of sidewall 15b with top surface 13a is shown to be sharp and sidewall 15b is shown relatively steep relative to the top surface of polycrystalline silicon 12 and the top surface 13a of phosphosilicate glass 13. Device 10, as illustrated, typically could comprise a portion of an EPROM, for example.

Figure 2:
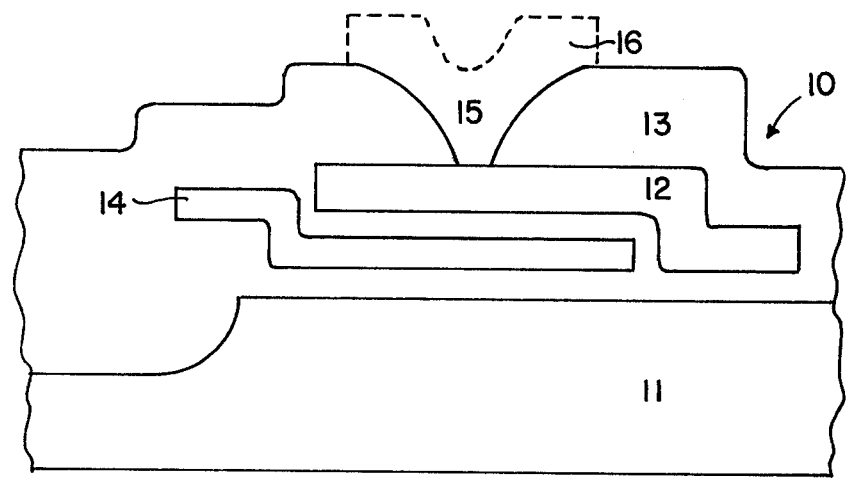
FIG. 2 illustrates the structure of FIG. 1 after reflow and shows the more gentle, curved nature of the sides (15b) of the via (15) after reflow.

FIG. 2 shows the structure of FIG. 1 after the device has been heated to a temperature sufficient to soften, or flow, the phosphosilicate glass 13 so as to round off edge 15a and thus allow the formation of a contact 16 to the exposed portion of the top surface of polycrystalline silicon gate 12. Contact 16 typically is of aluminum or metal. In the prior art, the flow of the phosphosilicate glass and the softening of the edge 15a and reduction of the slope of the sides 15b was done by heating the structure to a temperature of approximately 1000° C. in a dry ambient. This caused the dopants within the semiconductor material 11 to further distribute and thereby changed the characteristics of the device in an undesirable manner.

Figure 3:
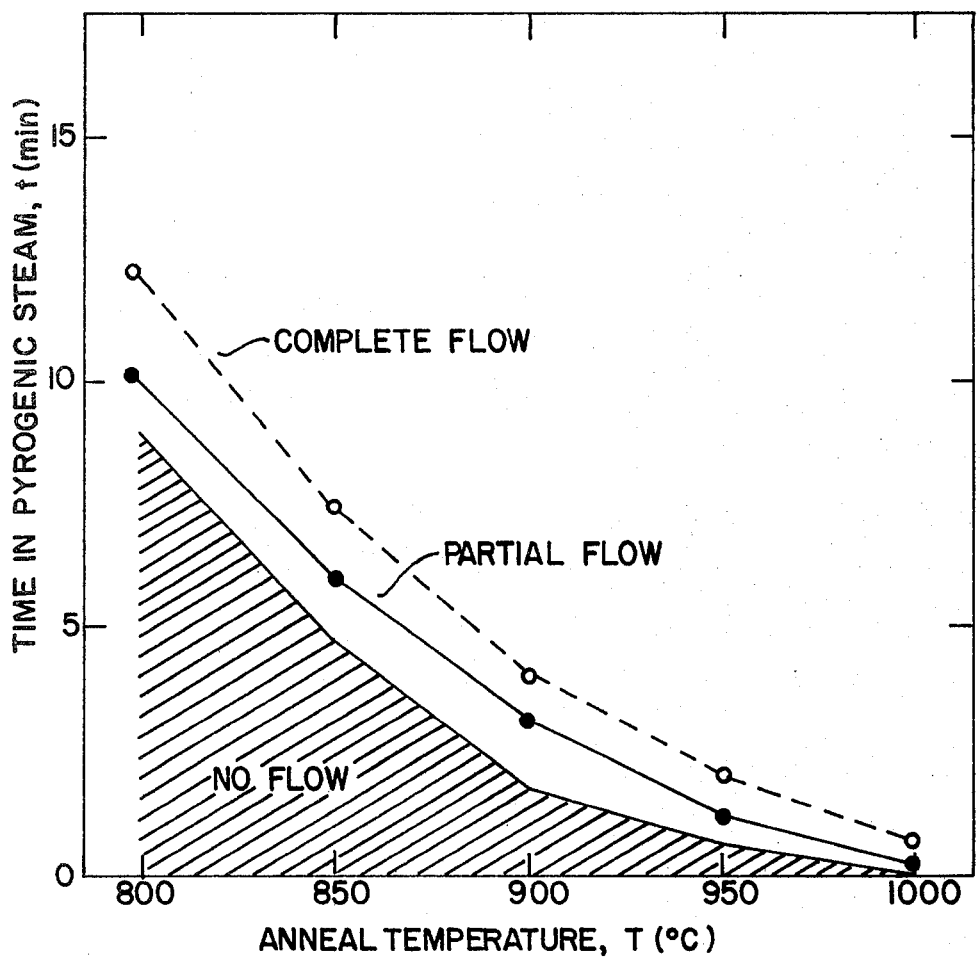
FIG. 3 is a graph showing the variation of time to flow as a function of temperature for 25 atmospheres pressure and one (1) atmosphere pressure.

The method of this invention involves heating the device 10 under pressure in an inert ambient containing moisture or in a steam ambient to achieve flow of the glass at a temperature lower than that possible at one atmosphere. FIG. 3 illustrates this invention. FIG. 3 comprises a graph of time to flow a phosphosilicate glass such as glass layer 13 shown in FIGS. 1 and 2 versus the temperature in degrees centrigrade at which the glass flows. At 25 atmospheres pressure in a steam or wet environment, the phosphosilicate glass 13 flows at 800° C. in about 12 minutes. As the time to flow is decreased, the temperature to which the structure must be heated (at 25 atmospheres) increases as shown by the graph. The subjection of the semiconductor device of FIGS. 1 and 2 to an 800° C. temperature for 12 minutes does not materially affect the dopant profiles within the device structure but does allow the phosphosilicate glass 13 to flow so that the device structure as shown in FIG. 1 becomes similar in cross-section to the structure shown in FIG. 2. The sharp edges 15a shown in FIG. 1 have been rounded as shown in FIG. 2 at temperatures sufficiently low that little or no dopant redistribution occurs in the underlying substrate 11. Thus, in accordance with this invention the temperature at which flow of phosphosilicate glass is obtained is reduced at least 100° C. or more while the heating time of the device remains the same.

In contrast, prior art methods of flowing glass at one (1) atmosphere pressure require that device 10 be subjected to, for example, a temperature of 900° C. for 44 minutes. If temperatures slightly lower than 900° C. are used at one (1) atmosphere pressure, the time required for glass flow is increased from 44 minutes. Temperatures in excess of 900° C. require only slightly less time than 44 minutes for the glass to flow. Subjecting device 10 to such temperatures for the substantially greater time required to cause the glass to flow utilizing prior art methods at one (1) atmosphere pressure does cause further diffusion of dopants, thus causing an undersired change in the dopant profiles.

Figure 4:
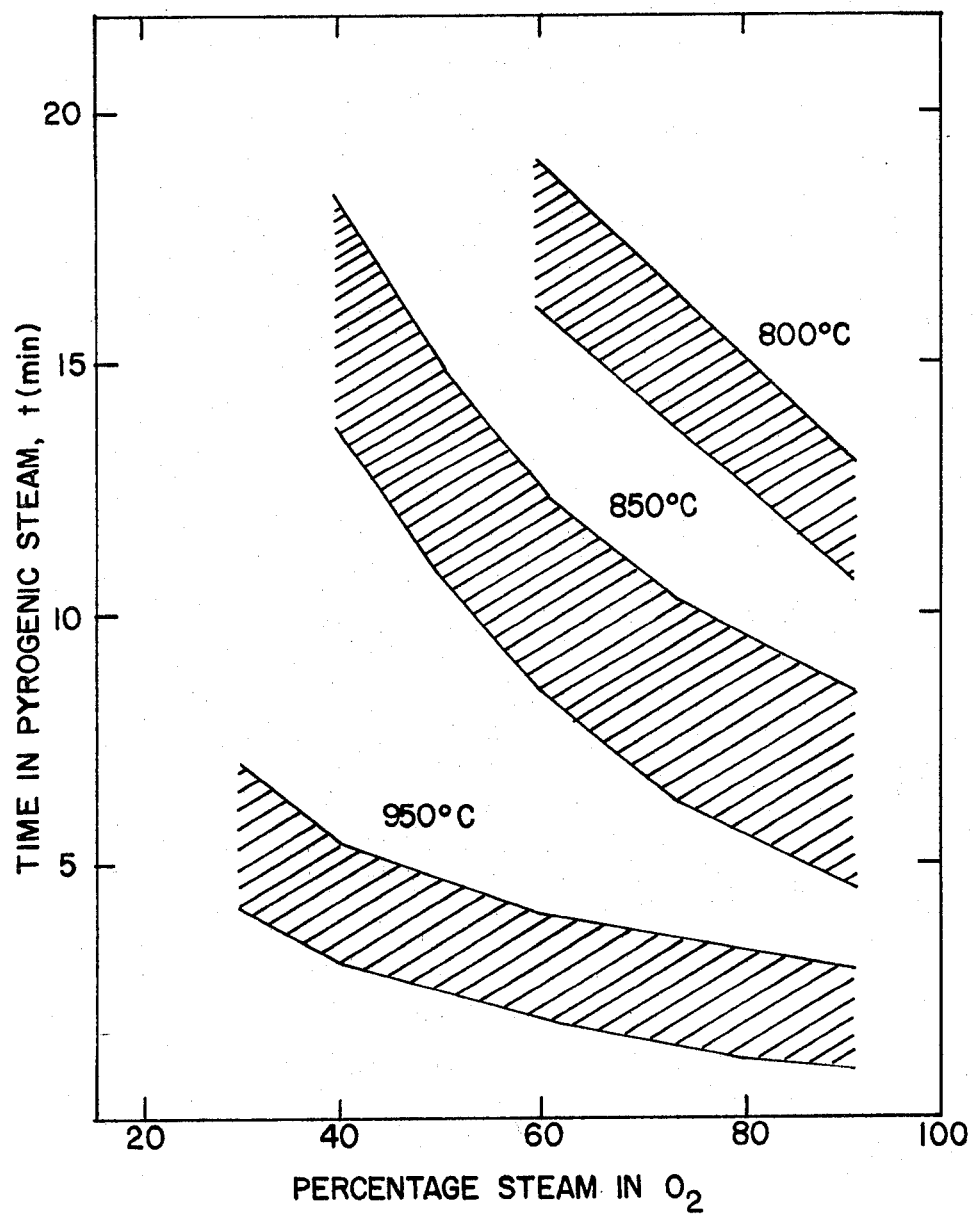
FIG. 4 shows the time to flow as a function of the percentage of moisture in the atmosphere in which the integrated circuit is placed for heating to obtain reflow of glass.

Experiments show that the water content of the ambient plays a critical role in the process. Experiments also show that the time to flow the phosphosilicate glass is a function of the percentage of moisture in the ambient. As the moisture content increases from approximately 40% to 100%, the time to flow decreases as shown by the curve in FIG. 4.

Experiments also show that moisture must be present in the ambient to achieve the results shown in FIG. 3. When raw silicon is exposed to a moisture atmosphere at these pressures the silicon oxidizes. However, the solution to this problem is to process the wafer at a high pressure, in accordance with this invention, prior to completely forming the contact holes.

The variables which must be controlled in implementing the process of this invention are pressure, temperature and moisture content of the ambient. Experiments have shown that the phosphorus content over a reasonable range has no effect on the results. Thus, a low phosphorus content phosphosilicate glass containing about 6% phosphorus by weight in the glass will reflow in approximately the same time as a phosphosilicate glass containing a higher percentage phosphorus content. Reducing the steam content of the ambient increases the time to flow the phosphosilicate glass. Experiments have shown that three different flow regimes are obtained depending upon the ambient, the temperature, the pressure and the time. These three regimes are characterized as "no flow", "intermediate flow" and "full flow". In intermediate flow, the sharp edge boundary can just be discerned in the structure but sufficient flow has occurred to allow a contact to be made over the edge and down into the contact region without significant danger of cracking. Full flow removes any reminder of the sharp edge boundary.

By increasing the pressure, the temperature is further reduced for a given amount of flow.

Ambients suitable for use with this invention include nitrogen and argon. Using wet nitrogen with 2 to 3 parts per million of water moisture is also adequate to achieve the results of the type shown in FIG. 3. Experiments show that phosphosilicate glass, even at atmospheric pressure, flows more easily if there is moisture in the atmosphere. The experiments show that the flow is invarient between about 6% to 9% of phosphorus content by weight in the phosphosilicate glass.

The pressure at which the reflow of the phosphosilicate glass 13 (FIG. 1) is obtained at a temperature below about 550° C. is important. At this pressure, the aluminum will not melt thereby allowing the reflow of glass in conjunction with phosphosilicate glass/aluminum interconnect systems. This greatly simplifies the processing of semiconductor devices. At high pressures, the melting temperature of aluminum increases while the reflow temperature of the phosphosilicate glass decreases thereby providing a glass-metal system which is inherently compatible with the high pressure flow techniques of this invention.

What is claimed is:

1. In the manufacture of an integrated circuit, the method of flowing a silicon oxide glass containing phosphorous, said glass being deposited on an underlying semiconductor material, said semiconductor material containing dopants, which method comprises:
    (a) raising the pressure acting on said glass, after said glass has been deposited on said semiconductor, above atmospheric pressure in an environment containing moisture for a selected period of time;
    (b) simultaneously heating said glass to a selected temperature less than 1000° C. for said time, said pressure, time and temperature being selected so as to prevent redistribution of the dopant within the semiconductor material but sufficient to cause said glass to flow and density; and
    (c) returning the resulting structure to atmospheric pressure and temperature.

2. The method of claim 1 wherein said glass is raised to a selected pressure above ambient in an environment comprising moisture and oxygen.

3. The method of claim 1 wherein said glass is raised to a selected pressure above ambient in an environment comprising moisture and inert gas.

4. The method of claim 1 wherein said glass is raised to a pressure within a range of pressures sufficient that said glass flows at a temperature within the range of 750° C. to 1000° C.

5. The method of claim 4 wherein said glass is raised to a pressure of approximately 25 atmospheres.

6. The method of claim 4 wherein said glass is raised to a pressure of approximately 25 atmospheres and wherein said environment includes oxygen.

7. The method of claim 4 wherein said glass is raised to a pressure of approximately 25 atmospheres and wherein said environment includes an inert gas.

8. The method of claim 1 wherein the semiconductor material comprises silicon, and the method includes the additional step of first forming a via part way through said glass prior to raising the pressure, said via having a discernible edge between the sides of the via and the top of said glass, and simultaneously heating said glass and wherein the edges of said via are rounded by the flow of said glass resultant from the heating of said glass.

9. The method of claim 1 or 8 in which said glass contains from between about 6% to 9% by weight of phosphorous.

* * * * *